US006951585B2

United States Patent
Nakagawa et al.

(10) Patent No.: US 6,951,585 B2
(45) Date of Patent: Oct. 4, 2005

(54) LIQUID-PHASE GROWTH METHOD AND LIQUID-PHASE GROWTH APPARATUS

(75) Inventors: Katsumi Nakagawa, Kyoto (JP); Shunichi Ishihara, Kyoto (JP); Hiroshi Sato, Nara (JP); Shoji Nishida, Nara (JP); Yasuyoshi Takai, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 198 days.

(21) Appl. No.: 10/397,310

(22) Filed: Mar. 27, 2003

(65) Prior Publication Data

US 2003/0188680 A1 Oct. 9, 2003

(30) Foreign Application Priority Data

Apr. 5, 2002 (JP) .................................... 2002-103166

(51) Int. Cl.⁷ .............................................. C30B 19/10
(52) U.S. Cl. .............................. 117/54; 117/13; 117/56
(58) Field of Search ........................ 117/13, 54, 56

(56) References Cited

U.S. PATENT DOCUMENTS

| 6,211,038 B1 * | 4/2001 | Nakagawa et al. ......... 438/409 |
| 2002/0009895 A1 | 1/2002 | Nishida et al. ............. 438/758 |

FOREIGN PATENT DOCUMENTS

JP          10-98205         4/1998

OTHER PUBLICATIONS

Haruo Itoh et al., "Characterization of Silicon Layers Epitaxially Grown on Metallurgical–Grad Polychrystalline Substrates," 45 *J. Crystal Growth* 446–453 (1978).

K.J. Weber et al., "Liquid Phase Epitaxy of Silicon on Multicrystalline Silicon Substrates," 154 *J. Crystal Growth* 54–59 (1995).

G. Ballhorn et al., "High–Efficiency Multicrystalline Silicon Solar Cells by Liquid Epitaxy," 52 *Solar Energy Materials and Solar Cells* 61–68 (1998).

* cited by examiner

*Primary Examiner*—Felisa Hiteshew
(74) *Attorney, Agent, or Firm*—Fitzpatrick, Cella, Harper & Scinto

(57) ABSTRACT

A liquid-phase growth method for immersing a polycrystalline substrate in a melt in a crucible wherein crystal ingredients are dissolved, thereby growing poly crystals upon the substrate, comprises a first step for growing poly crystals to a predetermined thickness, and a second step for melting back a part of the poly crystals grown in the first step in the melt, wherein the relative position between the substrate and melt is changed between the first step and second step, bringing melt with different temperature into contact with the polycrystalline surface. The obtained poly crystals have properties rivaling those of poly crystals used in conventional solar cells but with little risk of trouble such as line breakage of grid electrodes in application to solar cells, and can be obtained in great quantities at low costs.

11 Claims, 5 Drawing Sheets

LIQUID-PHASE GROWTH METHOD AND LIQUID-PHASE GROWTH APPARATUS

BACKGROUND OF THE INVENTION

1. Field of the Invention

The present invention relates to a liquid-phase growth method for polycrystalline semiconductors such as silicon or the like which can be suitable used as semiconductors for solar cells, and to a liquid-phase growth apparatus suitable for carrying out this method.

2. Description of the Related Art

Increased public awareness regarding the environment has led to widespread consumer-grade use of solar cells. Consumer-grade solar cells primarily use monocrystalline or polycrystalline silicon wafers. Conventionally, monocrystalline silicon wafers have often been manufactured reusing silicon wafers which did not meet standards in the integrated circuit industry or the like, or silicone wafers left over from pulling, so there has been a limit in the amount thereof which can be supplied.

As for polycrystalline silicon wafers on the other hand, the throughput of the crystallization process is higher than that of mono crystals, but there still is a limit in the amount thereof which can be supplied in the event of using high-purity silicon for semiconductors as the ingredient thereof, and the cost cannot be reduced very much, either.

Now, methods for growing a polycrystalline silicon film on a ceramic substrate such as glassy carbon or mullite or the like are being attempted, but these normally require growth to be performed under high temperatures of 1,000 to 1,500° C., so inexpensive materials such as metal plate or glass or the like cannot be easily used, from the perspective of heat-resistance and matching of thermal expansion. Further, polycrystalline silicon film thus grown on such a substrate has small crystal grains and the smoothness of the surface tends to be poor, and accordingly practical use has yet to be achieved.

As an attempt for solving this problem, there is a method wherein polycrystalline silicon (metallurgical grade silicon) manufactured using inexpensive unrefined silicon is used as a substrate, and polycrystalline silicon grown thereupon using high-purity silicon is used as an activation layer, thereby forming a solar cell.

For example, Haruo ITO, Tadashi SAITOH, Noboru NAKAMURA, Sunao MATSUBARA, Terunori WARABISAKO, and Takashi TOKUYAMA have produced a trial solar cell by growing silicon poly crystals on a metallurgical grade silicon substrate by CVD (chemical vapor deposition) using SiH2Cl2 (J. Crys. Growth 45 (1978) 446–453). In this case, the substrate is silicon, so there are no problems with heat-resistance and matching of thermal expansion. Also, the ingredient is inexpensive so there is no restriction on resources, and products may be provided inexpensively. Further, the grown polycrystalline silicon film takes on the crystalline properties of the substrate, so poly crystals with good quality can be grown more readily than with cases using glassy carbon or ceramics for the substrate.

However, there are many problems in manufacturing, such as in the event of growing with the above-described CVD method, the ingredient gas cannot be used 100% effectively for growing, and growing silicon to a thickness of several dozen μm necessary for a solar cell requires the growth apparatus to be maintained frequently.

The liquid-phase growth method can be used for growing polycrystalline silicon. With the liquid-phase growth method, an ingredient such as silicon or the like is dissolved in a low-melting-point metal such as indium, gallium, tin, copper, aluminum, or the like, and adjusting a melt, following which supersaturation is induced by cooling or the like, so as to grow crystals on a substrate dipped therein. The silicon does not flow out from the melt, so there is no waste of the ingredients placed therein, and maintaining the apparatus is easy.

A method wherein high-quality polycrystalline silicon is grown on a polycrystalline substrate of inexpensive metallurgical grade silicon using this liquid-phase growth method, and forming a solar cell using the polycrystalline silicon, is disclosed in Japanese Patent Laid-Open No. 10-098205. According to this method, a polycrystalline substrate of metallurgical grade silicon can be filled in a mold and melted to achieve direct formation, so there is no need to take the trouble of ingot formation or slicing, and this method is further advantageous cost-wise. However, of course, substrates formed by forming ingots using inexpensive metallurgical grade silicon and slicing the ingot may be used suitably, as well.

However, as shown in FIG. 2, in the event of manufacturing solar cells using a polycrystalline growth layer 202 grown on a polycrystalline substrate 200, grid electrodes 206 formed on the surface thereof often exhibit line breaks in grid electrodes formed thereupon, regardless of whether metallurgical grade silicon is used or not. The grid electrodes 206 serve to collect carriers occurring due to incident light, and in the event that there are line breaks in the grid electrodes 206, the conversion efficiency of the solar cell deteriorates markedly. Also, forming the grid electrodes 206 so as to be heavier makes line breakage more difficult to occur, but loss of incident light due to the shadows of the grid electrodes 206 increases, which also is undesirable.

The cause of such problems is thought to be due to the following. A grain boundary 201 exists in the polycrystalline substrate 200, and the crystal orientation differs within crystal grains on either side of the grain boundary 201. Growing a polycrystalline growth layer 202 thereupon forms a grain boundary 203 at the same position as the grain boundary 201 on the substrate in the polycrystalline growth layer 202, since microscopically, crystals grow epitaxially at each of the regions of the crystal grains. A groove 205 is generally formed on the grain boundary 203, but as shown by K. J. Weber and A. W. Blakers, the groove tends to be deeper with poly crystals grown with liquid-phase growth as compared to poly crystals grown with CVD (J. Crys. Growth 154 (1995) 54–59). Accordingly, solar cells using such poly crystals readily exhibit line breaks in the grid electrodes 206, regardless of the excellent properties of the poly crystals grown with this liquid-phase growth.

On the other hand, increase in the thickness of poly crystals serving as the activation layer of the solar cell increases the output electric current due to increased absorption of incident light, which is a preferable property. However, this makes the groove deeper at the same time, making line breakage of the grid electrodes 206 more easy to occur.

Accordingly, it can be said that an average thickness W of the poly crystalline layer shown in FIG. 2 which is as great as possible, with an average depth G2 of the groove as small as possible, i.e., as small a G2/W as possible, serves as an indication of whether poly crystals are suitable for application to solar cells. In fact, as will be described later with reference to FIG. 1 in the description of the present invention, a small G1/W prevents grid electrode line breakage and increases output current thereby yielding high conversion efficiency.

G. Ballhorn, K. J. Weber, S. Armand, M. J. Stokes, and A. W. Blakers have proposed a method for reducing the depth of the groove formed at the grain boundary in liquid-phase growth of polycrystalline silicon on a polycrystalline substrate (Solar Energy Materials & Solar Cells 52 (1998) 61–68). As shown in FIG. 5, they state that the groove can be made less deep by, instead of simply dropping the temperature of the melt from Th to T1 during the period between dipping the substrate in the melt (t0) to pulling the substrate from the melt (tf), providing a period for heating the melt by ΔTh partway through the period. As for the reason thereof, they state that the grain boundary has an unstable structure and accordingly greater energy is required for growth thereupon as compared to growth within crystal grains, so the speed of growth relatively drops in the liquid grown method where growth occurs in a state close to thermal equilibrium in particular, thus forming a groove, but silicon melts out (melt-back) first from regions other than the grain boundary within the crystal grains upon being heated, so the groove becomes relatively shallower.

However, with large-scale liquid-phase growth apparatuses, there is the need to handle a large melt, anywhere from 10 kg or so up to several hundred kg. In the event of repeating cooling and heating of the melt as shown in FIG. 5, the time required for growth becomes longer, decreasing manufacturing throughput, and unnecessary energy is required for manufacturing, which is undesirable.

SUMMARY OF THE INVENTION

The present invention has been made in light of the above problems, and accordingly, it is an object thereof to provide a liquid-phase growth method wherein poly crystals, having properties rivaling those of poly crystals used in conventional solar cells but with little risk of trouble such as line breakage of grid electrodes in application to solar cells, can be obtained in great quantities at low costs, and to provide a liquid-phase growth apparatus suitable for carrying out this method.

To this end, according to a first aspect of the present invention, the liquid-phase growth method for immersing a polycrystalline substrate in a melt in a crucible wherein crystal ingredients are dissolved, thereby growing poly crystals upon the substrate, is a method comprising: a first step for growing poly crystals to a predetermined thickness; and a second step for melting a part of the poly crystals grown in the first step in the melt; wherein the relative position between the substrate and melt is changed between the first step and second step, bringing melt with different temperature into contact with the polycrystalline surface.

The first step and the second step are preferably alternately repeated a plurality of times. In this case, in the second step, a region of 5% or more but 30% or less of the predetermined thickness of the poly crystals grown in the first step is melted in the melt, and the thickness of poly crystals to be grown in the first step is preferably 1 to 20 μm.

Further, preferably, in the first step, the substrate is brought into contact with melt with a relatively high temperature, and in the second step, the substrate is brought into contact with melt with a relatively low temperature, with the temperature in each region of the melt being lowered.

The first step and the second step are preferably carried out in the same crucible, and in this case, the substrate should be alternately brought into contact with melt with a relatively high temperature and with melt with a relatively low temperature in the first and second steps, by vertically reciprocally moving the substrate in the crucible. Or, the first step and the second step may be carried out in different crucibles.

Additionally, the content of crystal ingredients per increment volume in the melt coming into contact with the poly crystal surface preferably differs between the first step and the second step.

According to a second aspect of the present invention, a liquid-phase growth apparatus comprises at least: a melt for dissolving crystal ingredients; a crucible for storing the melt; heating means capable of forming a temperature distribution in the melt; a support for supporting the substrate; and support driving means for changing the relative position of the substrate and melt, between a region where the temperature of the melt is relatively high and a region where the temperature thereof is relatively low.

The heating means capable of forming a temperature distribution in the melt is preferably a vertically separated, independently-driveable heater. Also, the means for changing the relative position of the substrate and melt is preferably means for raising and lowering the substrate. The heating means capable of forming a temperature distribution in the melt is preferably a circumferentially separated, independently-driveable heater. In this case, the means for changing the relative position of the substrate and melt is preferably means for rotating the substrate around the center axis of the crucible, and the means for changing the relative position of the substrate and melt suitably includes means for rotating the crucible.

According to such an arrangement, the groove formed in the poly crystals does not become deeper than the thickness of the polycrystalline layer, so grid line breakage which tends to occur in the event of manufacturing solar cells using such poly crystals, can be prevented. This is particularly suitable for mass-manufacturing of solar cells in the event of using large melts, since application can be made without loosing throughput.

Further objects, features and advantages of the present invention will become apparent from the following description of the preferred embodiments with reference to the attached drawings.

DESCRIPTION OF THE PREFERRED EMBODIMENTS

The following is a description of embodiments of the present invention with reference to the drawings, but it should be noted that the present invention is in no way restricted by the embodiments.

The liquid-phase growth method according to the present invention has a first step for growing poly crystals, and a subsequent second step for melt-back of the poly crystals. Intentionally growing poly crystals on the substrate and melting these back by controlling temperature of the melt and so forth is a feature of the present invention, and the present invention differs from methods for simply dipping the substrate in a melt and then pulling it in this point. These steps are preferably alternated multiple times, in the manner of first step, second step, first step, second step, and so on. A certain thickness is necessary to obtain a photo-electric current in order to achieve high efficiency with solar cells, but continuing growth for a long time for this purpose makes grooves deeper, and as the grooves become deeper, the melt with high silicon concentration is less and less readily supplied to the bottom thereof, so growth there occurs slower than the other portions, making the grooves even more pronounced. While portions other than the grooves may be selectively melted back at a later time, the melt-back is preferably performed several times before the grooves develop to such an extreme level, thereby reaching the necessary layer thickness.

The thickness of the poly crystal layer to be grown each time the first step is performed is preferably 1 to 20 $\mu$m. A thickness smaller than this range makes control of the layer thickness difficult, and the number of steps increases, resulting in poor manufacturing efficiency. On the other hand, a thickness greater than this range makes the unevenness too great, to where the effects of smoothing are markedly reduced.

Also, the amount of melt-back of the poly-crystals in the second step is preferably between 5% to 30% of the poly crystals grown in the first step. Anything under this range results in control of unevenness being almost impossible, control of the layer thickness being difficult, and the number of steps increases, resulting in poor manufacturing efficiency. In the event of exceeding this range, triangular and square recesses are readily formed on the surface following growing, and further, many of the grown poly crystals are wasted, so manufacturing efficiency is poor.

Figure 3A:
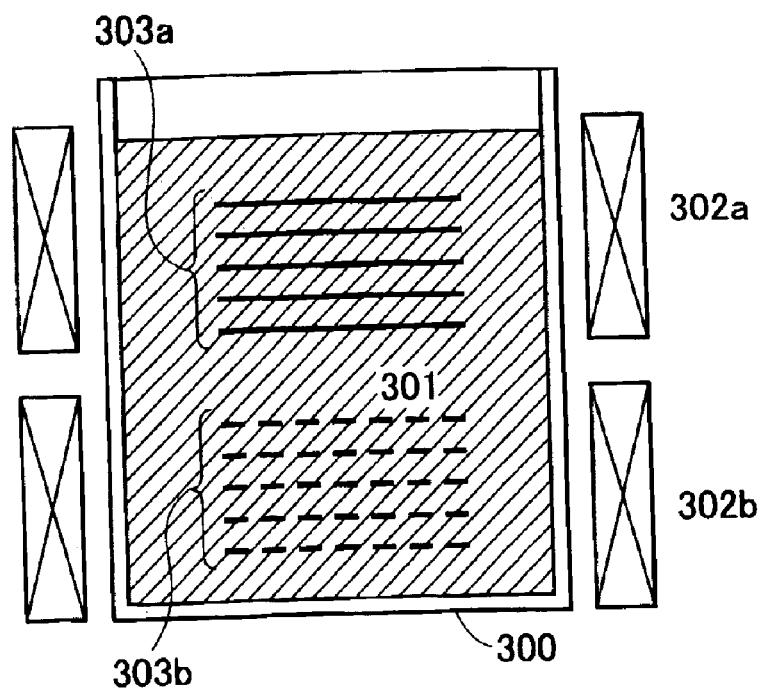
FIG. 3A is a cross-sectional pattern diagram illustrating the configuration of a liquid-phase growth apparatus suitable for carrying out the liquid-phase growth method according to the present invention.
Figure 3B:
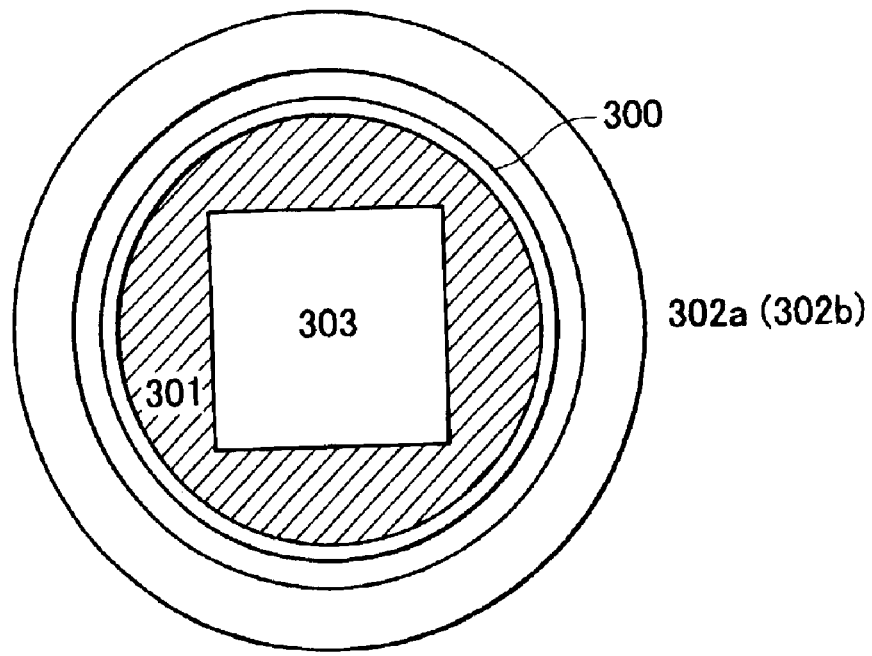
FIG. 3B is a plan view of that shown in FIG. 3A.

FIGS. 3A and 3B illustrate an example of a liquid-phase growth device suitable for carrying out the liquid-phase growth method according to the present invention. A preferred embodiment of the present invention will be described with reference thereto. While the following description will be specifically made with regard to a case of growing polycrystalline silicon on a polycrystalline silicon substrate, the present invention can be similarly applied to poly crystal growth of germanium and gallium phosphide and so forth, which are suitable for manufacturing devices such as solar cells.

In FIGS. 3A and 3B, reference numeral 300 denotes a crucible, formed of quartz glass or carbon, for storing a melt 301. The melt 301 has two heaters 302a and 302b, as heating means capable of forming temperature distribution in the melt 301 in the vertical direction of the crucible 300, the heaters being divided vertically such as to be independently driven. The temperature and vertical temperature distribution is controlled by the heaters 302a and 302b. Also, the crucible 300 is held within an unshown airtight chamber, which can be filled with a hydrogen atmosphere if necessary, so as to grow high-quality poly crystals.

First, a low-melting-point metal such as indium, gallium, tin, copper, aluminum, or the like, is placed in the crucible 300, and melted by the heaters 302a and 302b. Silicon, which is the ingredient, is dissolved therein to saturation, thereby forming the melt 301. The silicon ingredient may be wafers, powder, or nuggets.

Figure 6:
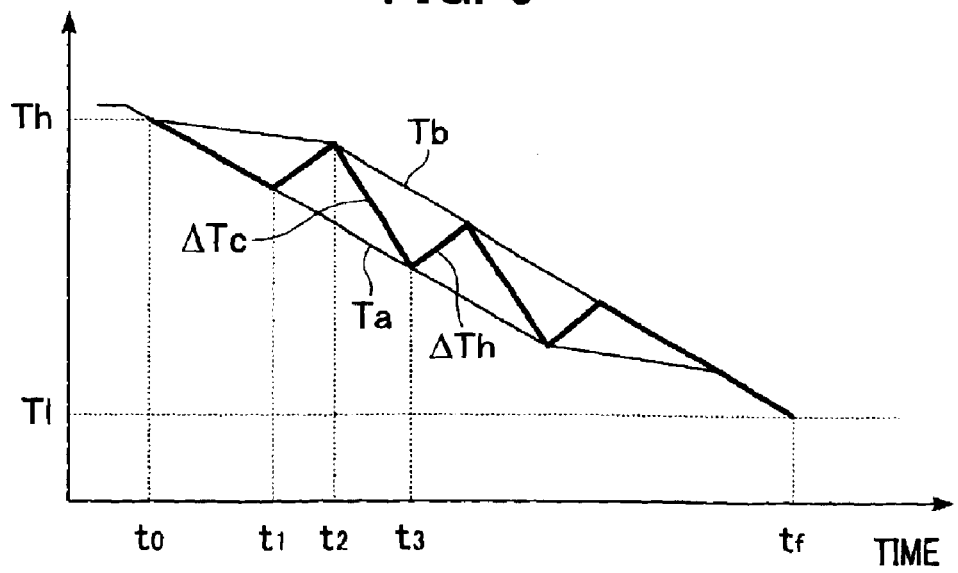
FIG. 6 is an explanatory diagram illustrating an example of a cooling profile of the melt according to the liquid-phase growth method according to the present invention.

Subsequently, the heaters 302a and 302b are controlled, and cooling of the melt begins as shown in FIG. 6. After cooling by a certain temperature, somewhere between several degrees to close to 100 degrees (t=t0 and Ta=Tb=Th), a substrate 303 is dipped in the melt 301, and held at a position 303a. At the same time, the heater 302b is driven independently from the heater 302a, such that the temperature (Tb) near the bottom of the crucible 300 cools less rapidly than the temperature (Ta) near the surface.

Further, at the point t=t1, the substrate 301 is lowered by an unshown substrate elevating mechanism from the position 302a to a position 303b near the bottom of the melt. This raises the temperature of the melt around the substrate by $\Delta$Th. At the point t=t2, the substrate 301 is raised from the position 303b to the position 303a again. This lowers the temperature of the melt around the substrate by $\Delta$Tc. The substrate 303 subsequently travels back and forth between 303a and 303b. The growth temperature at the substrate due to traveling back and forth changes between Ta and Tb at each time point, approximately following the change indicated by the solid line in FIG. 6. That is to say, a region with relatively high temperature and a region with relatively low temperature are formed in the melt, and the substrate is alternately moved between these, thereby repeating temperature increase of $\Delta$Th and temperature drop of $\Delta$Tc with regard to the melt around the substrate.

Figure 1:
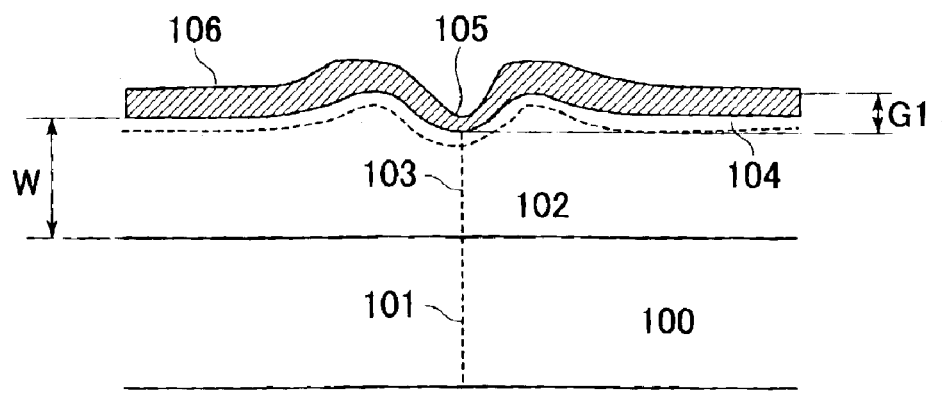
FIG. 1 is an explanatory diagram illustrating the cross-sectional state of a solar cell grown on a polycrystalline substrate by the liquid-phase growth method according to the present invention.
Figure 5:
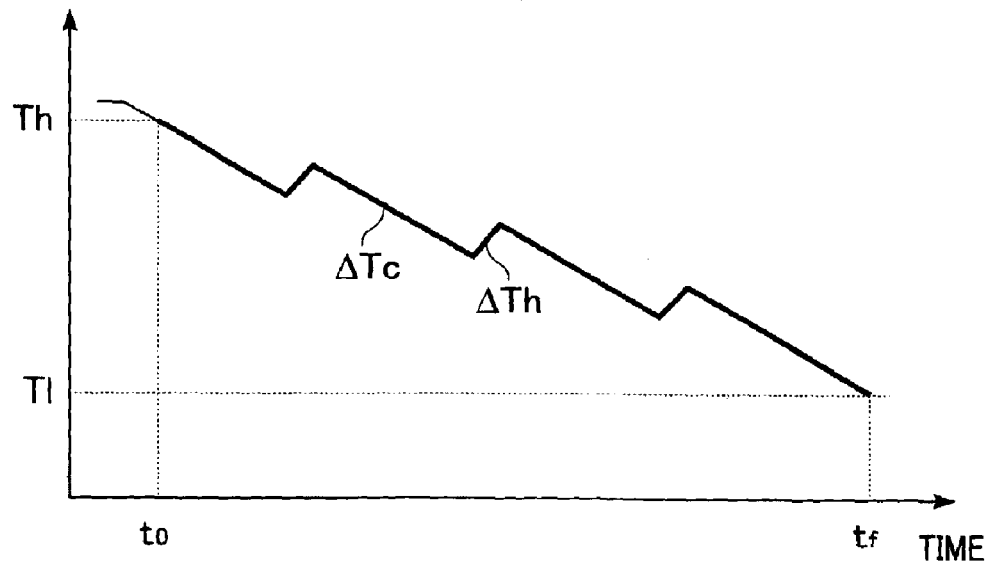
FIG. 5 is an explanatory diagram illustrating an example of a cooling profile of the melt recommended for suppressing poly crystal grooves in liquid-phase growth.

Now, there is communication in the melt between the region with high temperature and the region with low temperature, and the silicon can be mutually diffused, so the overall silicon concentration constantly tries to achieve concentration equilibrium. Consequently, in the region with low temperature, the silicon concentration becomes high for the low temperature which results in a supersaturated state, while in the region with high temperature, the concentration becomes low for the high temperature which results in an unsaturated state. Accordingly, traveling back and forth between these causes alternating growth and melt-back on the surface of the substrate 303. The amount of growth over a predetermined period and the amount of melt-back therein is thought to be approximately proportionate to the temperature difference between the temperature of the melt at the beginning of this period and the temperature of the melt at the end of the period, so long as this difference is not drastically great. Accordingly, the ratio between the thickness of growth of the poly crystal and the thickness of melt-back is approximately $|\Delta Th|:|\Delta Tc|$. Thus, development of grooves is suppressed in the same way as the cooling and heating of the entire melt shown in FIG. 5, and the ratio G1/W between groove depth and layer thickness of the polycrystalline layer grown is reduced as shown in FIG. 1, so grid electrodes formed on the surface thereof do not break as readily.

Moreover, with the liquid-phase growth method according to the present invention, there is no need to repeatedly heat and cool the entire melt even in case of using a large melt, so the growth can be completed in a short time, thereby improving throughput in production. Also, there is no wasted energy in the repeated heating and cooling, so high-quality poly crystals can be manufactured in great amounts.

Examples of modifications of the above-described embodiment include the following.

Figure 4A:
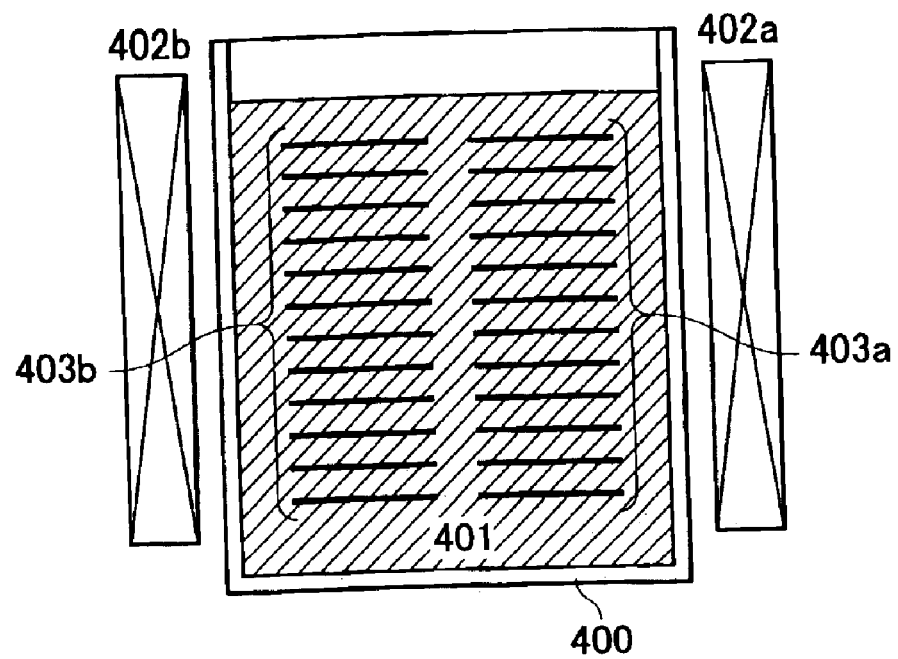
FIG. 4A is a cross-sectional pattern diagram illustrating the configuration of another liquid-phase growth apparatus suitable for carrying out the liquid-phase growth method according to the present invention.
Figure 4B:
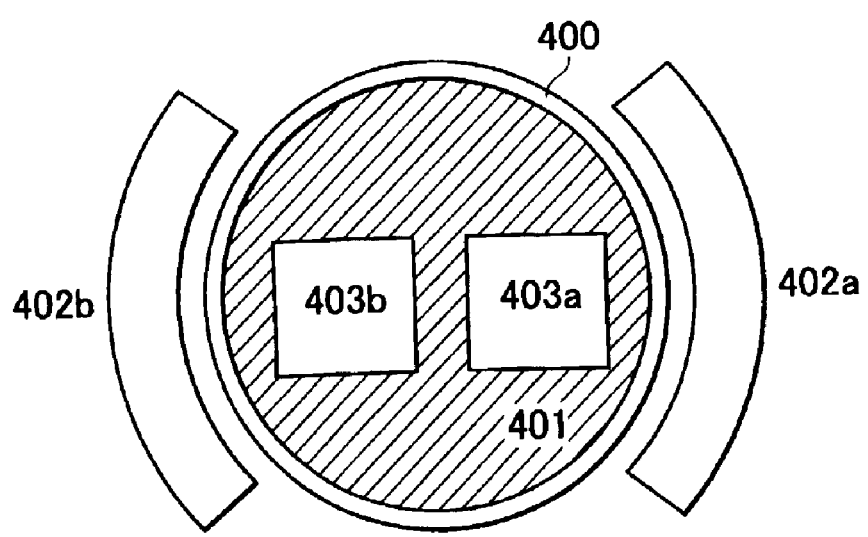
FIG. 4B is a plan view of that shown in FIG. 4A.

FIG. 4A is a cross-sectional pattern diagram illustrating the configuration of another liquid-phase growth apparatus suitable for carrying out the liquid-phase growth method according to the present invention, and FIG. 4B is a plan view of that shown in FIG. 4A.

With this liquid-phase growth apparatus, heaters 402a and 402b divided in two in the circumferential direction are provided around the center axis of the crucible 400, as heating means for forming temperature distribution in the melt 401. The heaters 402a and 402b are provided facing the side face of the crucible 400, and can each be independently driven. Also, two rows of multiple substrates 403 with a predetermined spacing in the vertical direction are arrayed using an unshown support. Rotating this support allows the substrates to be passed through the position 403a close to the heater 402a and the position 403b close to the heater 402b, alternately. Further, the heater 402b can be driven independently from the heater 402a, such that the temperature of the melt at the position 403b is set lower than the temperature of the melt at the position 403a.

The liquid-phase growth method the same as moving the substrates vertically can be realized using this apparatus, as well. Also, as an example, while the substrates are moved between a region with high temperature and a region with low temperature in the same crucible according to the above-described embodiment, an arrangement may be made wherein melt is held in multiple crucibles with the temperature of each melt differing.

Also, an arrangement may be made wherein, instead of a temperature distribution as described above, the substrates are moved between regions with the same temperature but different concentrations. In this case, the amount of crystal ingredient contained per cubic increment in the melt which comes into the polycrystalline surface differs from the first step to the second step. More specifically, the polycrystalline surface with which the melt comes into contact is the polycrystalline substrate surface for the first step, and the polycrystalline surface formed in the immediately preceding step for the second step. Examples of providing a concentration distribution include a method using multiple crucibles, a method using difference in specific gravity between solute and solvent, and so forth.

Further, with a preferable embodiment of the present invention, the relative position of the melt and substrate is relatively changed. To this end, an arrangement may be made wherein the crucible is moved instead of moving the substrates as described above, though the arrangement wherein the substrates are moved serves to simplify the moving mechanism.

Embodiments
(First Embodiment)

Metallurgical grade silicon with a purity of 98.5% was melted and slow-cooled in a vacuum smelter, thereby forming a polycrystalline silicon ingot. Thus was sliced to form polycrystalline silicon wafers 5 inches square, and then subjected to etching with a mixture of hydrofluoric acid, nitric acid, and acetic acid, smoothing the uneven surface acquired in the slicing process.

This polycrystalline silicon was formed of crystal grains several mm to 1 cm in diameter, with indefinite forms. The specific resistance thereof was around 0.05 Ω, and the conductor type was p.

Using the liquid-phase growth apparatus shown in FIGS. 3A and 3B, indium was placed in the crucible 300 and heated to 950° in a hydrogen atmosphere. A solar-cell-grade polycrystalline silicon wafer was placed on an unshown substrate elevating mechanism, and immersed in the indium while maintaining the hydrogen atmosphere, thereby forming a melt 301 saturated with silicon.

Next, the polycrystalline silicon wafer was removed from the substrate elevating mechanism, and five substrates 303 formed of metallurgical grade silicon were set thereupon, following which cooling of the melt was initiated. At the point that Ta=Tb=Th=950° C. was reached (t0), the substrates 303 were immersed in the melt, and held at the position 303a. At the point that Ta=900° C. was reached (ΔTc=−50° C., t1)the substrates 303 were slowly moved to the position 303b. At the point that moving was completed, Tb=915° C. was observed (ΔTh=15° C.). Then, the substrates 303 were slowly moved to the position 303a. At the point that the moving was completed Ta=865° C. was observed (ΔTc=−50° C.).

In the same way, the substrates 303 were repeatedly lowered and raised so as to attain the ΔTh=15° C., ΔTc=−50° C. in FIG. 6, with the substrates 303 being held at the position 303b at the end, and pulled from the melt at the point that Tb=800° C. reached (tf). That is to say, the temperature of the melt near the substrate changed following the profile shown by the heavy line in FIG. 6. This process required 70 minutes. In the event of following this temperature profile, the thickness of melt-back of the poly crystals can be thought to be 30% of the grown thickness.

Next, a phosphorous dispersant (OCD) as applied to the surface of the polycrystalline silicon, and diffusion of phosphor was performed for 30 minutes at a temperature of 900° C. Consequently, phosphor was diffused to a depth of approximately 0.2 μm from the surface of the polycrystalline silicon, thereby forming an n+ layer 104. Following removing the dispersant, a pattern for grid electrodes 106 was printed using silver paste on the surface thereof. The grid electrodes 106 were formed 150 μm in width and 20 μm in thickness. Titanium oxide was deposited thereupon to a thickness of approximately 550Å by sputtering to form an unshown reflection preventing film, thus forming a solar cell.

Measuring this solar cell with an AM 1.5 solar simulator showed conversion efficiency of 15.0%. Also, observation under microscope showed absolutely no line breaks in the grid electrodes 106 on the grooves 105. Further, cutting the solar cell and observing the cross-section with a microscope showed a polycrystalline silicon layer 50 μm in average thickness grown on the surface of the substrate 303. Grooves were observed in the polycrystalline silicon layer at the grain boundaries with the average thickness thereof being 10 μm. That is, under the definitions of FIG. 1, G1/W=20%.

Also, a solar cell of the same shape was fabricated according to the same procedures for liquid-phase growth other than setting ΔTh=2.5° C. and ΔTc=−50° C. In the event of following this profile, the thickness of melt-back of the poly crystals can be thought to be 5% of the grown thickness.

This solar cell yielded conversion efficiency of 14.5%. Also, microscope observation revealed the polycrystalline silicon layer to be around 50 μm in thickness, with a groove depth of around 20 μm, so under the definitions of FIG. 1, G1/W=40%. Further observing the shape of the grid electrodes of the solar cell with a metallurgical microscope reveled line breaks here and there. The reason that the conversion efficiency was somewhat lower than that of the solar cell with ΔTh=15° C. and ΔTc=−50° C. can be assumed to be due to the line breaks of the grid electrodes 206 owing to the deeper grooves.

(Comparative Example 1)

For comparison, polycrystalline silicon growth was carried out on a polycrystalline silicon substrate fabricated with metallurgical grade silicon the same as used in the first embodiment, in the same way except for adjusting the control parameters of the heater divided into two for heating the melt, thus changing ΔTh and ΔTc.

In the same way as with the first embodiment, a polycrystalline silicon wafer was melted into indium at temperature of 950° C., cooling of the melt was started, the metallurgical grade silicon substrates 303 were immersed at the point that the temperature of the melt reached 940° C., cooling was continued at the same pace, i.e., with ΔTc=0° C., and the substrates were pulled at the point that the melt reached a temperature of 800° C. This required 70 minutes.

Polycrystalline silicon approximately 50 μm in thickness had grown on the substrates, as with the first embodiment. Subsequently, the n+ layer 104 and unshown reflection preventing film were formed as with the first embodiment.

Figure 2:
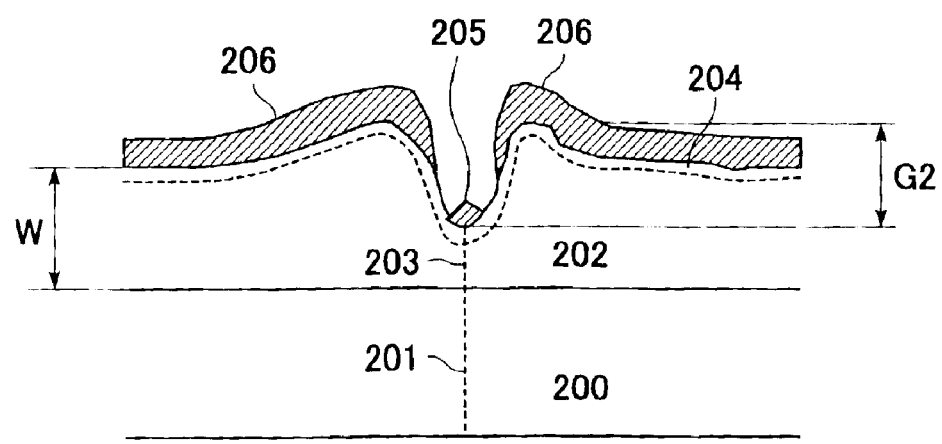
FIG. 2 is an explanatory diagram illustrating the cross-sectional state of a solar cell wherein grid electrode breakage has occurred due to growing on a polycrystalline silicon substrate with a conventional liquid-phase growth method.

This solar cell yielded conversion efficiency of 11.5%. Also, microscope observation revealed countless line breaks in the grid electrodes 206 on the grove, such as shown in FIG. 2. The groove depth was around 30 μm, so under the definitions of FIG. 2, G2/W=80%. The reason that the conversion efficiency of the solar cell according to this comparative example was lower than that of the solar cell according to the first embodiment was found to be due to the line breaks of the grid electrodes owing to the deep grooves since the liquid-phase growth method according to the present invention was not used, so the electric current generated by the incident light could not be collected effectively.

Also, polycrystalline silicon growth was similarly performed with ΔTh=2° C. and ΔTc=−50° C. In the event of following this temperature profile, the thickness of melt-back of the poly crystals can be thought to be 4% of the grown thickness. The groove depth was 30 μm, so G2/W= 60%, and the conversion efficiency of this solar cell was 12.3%.

Further, polycrystalline silicon growth was similarly performed with ΔTh=20° C. and ΔTc=−50° C. In the event of following this temperature profile, the thickness of melt-back of the poly crystals can be thought to be 40% of the grown thickness. The groove depth was 7 μm, and improvement was made to G2/W=14%, but the conversion efficiency of this solar cell actually dropped to 13.7%. Observing the surface of the poly crystals again, it was found that inverse-pyramid-shaped recesses occurred at some parts, which were found to be degrading the properties. These recesses are assumed to be due to great melt-back occurring locally on minute defects on the polycrystalline surface, owing to the great melt-back amount.

From the above experiments, it was found that the thickness for polycrystalline melt-back should be within the range of 5 to 30% of the grown thickness.

(Comparative Example 2)

Polycrystalline silicon was grown on the polycrystalline silicon substrate fabricated with the same metallurgical grade silicon used with the first embodiment, with the same liquid-phase growth apparatus used in comparative example 1. With the present embodiment, the heaters were controlled, so as to attempt to control the temperature of the entire melt following the heavy line in FIG. 5.

However, the melt was 10 kg in weight, and even if melt which is being cooled is heated in turn, or if melt which is being heated is cooled in turn, the temperature of the melt does not rapidly follow. As attempts to improve this, the capacity of the heaters were increased, and liquid hydrogen coolant was run about the crucible to cool rapidly, but even then 120 minutes were required to for temperature change from 940° C. to 800° C. with ΔTh=20° C. and ΔTc=−60° C.

With the solar cell using the polycrystalline silicon fabricated according to the present embodiment, no grid electrode line breakage was observed, and the conversion efficiency was 14.8%, which was almost the same as the first embodiment. However, the results of the present comparative example show that controlling the temperature of the entire melt and achieving ΔTh and ΔTc with large melts requires time, and accordingly this arrangement was found to be inferior to the first embodiment in terms of production efficiency.

(Second Embodiment)

With the present embodiment, an example will be described using a liquid-phase growth apparatus shown in FIGS. 4A and 4B that is optimal for growth on a greater number of substrates per batch.

Metallurgical grade silicon with a purity of 98.5% was melted and slow-cooled in a vacuum smelter and subsequently poured into a carbon mold and slow-cooled, thereby directly forming polycrystalline silicon substrates 5 inches square, which were subjected to etching with a mixture of hydrofluoric acid, nitric acid, and acetic acid, smoothing the uneven face which was in contact with the mold. The polycrystalline silicon was formed of crystal grains several mm to 1 cm in diameter, with indefinite forms. The specific resistance thereof was around 0.05 Ω, and the conductor type was p.

With this liquid-phase growth apparatus, heaters 402a and 402b divided in two in the circumferential direction are provided around the center axis of the crucible 400, as heating means for forming temperature distribution in the melt 401. The heaters 402a and 402b are provided facing the side face of the crucible 400, and can each be independently driven. Also, two rows of 50 each of multiple substrates 403 with a predetermined spacing in the vertical direction, i.e., 100 substrates in total, are arrayed using an unshown support. Rotating this support allows each substrate to be passed through the position 403a close to the heater 402a and the position 403b close to the heater 402b, alternately. Further, the heater 402b can be driven independently from the heater 402a, such that the temperature of the melt at the position 403b is set lower than the temperature of the melt at the position 403a.

Indium was placed in the crucible 400 and the entire melt was heated to 950° in a hydrogen atmosphere. A solar-cell-grade polycrystalline silicon nuggets were set in an unshown quartz glass holder for this purpose, and immersed in the indium, thereby forming a melt 401 saturated with silicon.

Next, the substrates 403 formed of metallurgical grade silicon were set on an unshown support, following which cooling of the melt was started, and continued to the point that the temperature of the melt near the heater 402a was Ta in FIG. 6, and the temperature of the melt near the heater 402b was Tb in FIG. 6. At the point that Ta=Tb=Th=940° C. was reached (t0), the substrates 403 were immersed in the melt. At the point that Ta=900° C. was reached (t1) the support was slowly rotated by 180°. The substrates which were initially at the portion 403a were thus moved to the position 403b, and the substrates were subjected to Tb=920° C. On the other hand, the temperature of the substrates which were initially at the portion 403b were subjected to changed from approximately 930° C. to 900° C. Subsequently, the support was slowly rotated by 180° C. at the points t2, t3, and so forth.

Figure 7:
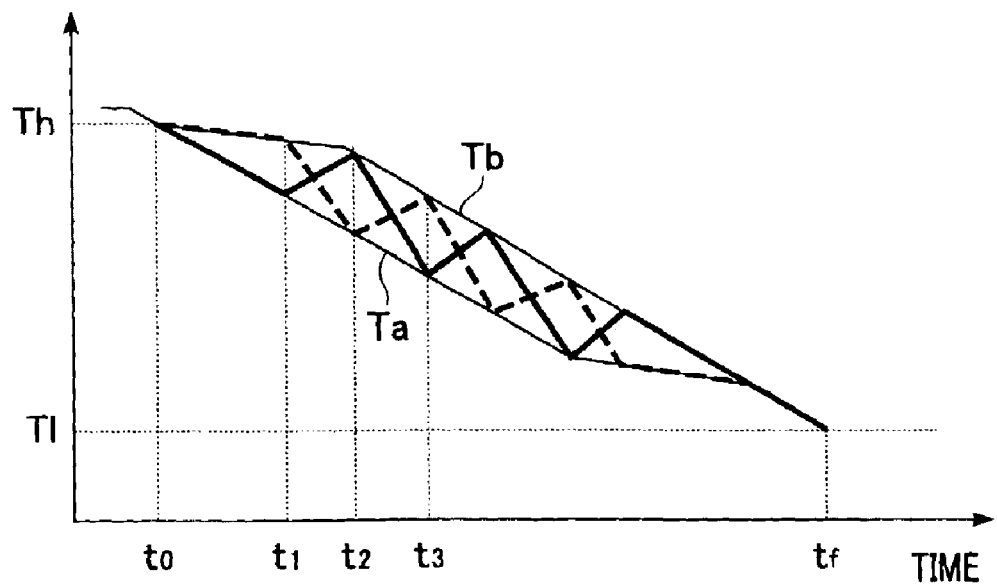
FIG. 7 is another explanatory diagram illustrating an example of a cooling profile of the melt according to the liquid-phase growth method according to the present invention.

As a results, the temperature of the substrates in the row which was initially at the position 403a changed according to the heavy solid line shown in FIG. 7. Also, the temperature of the substrates in the row which was initially at the position 403b changed according to the heavy dotted line shown in FIG. 7. The transition from t0 to tf required 70 minutes. With the liquid-phase growth apparatus according to the present embodiment, the melt was approximately 200 kg, which was approximately twenty times that of the liquid-phase growth apparatus according to the first embodiment, but the great amount of the melt caused no difficulties in temperature control, thereby proving the advantages of the present invention.

Then, a solar cell was fabricated according to the same procedures as with the first embodiment. This solar cell yielded conversion efficiency of 14.7%. Also, microscope observation of the cross-section thereof revealed an average of G1/W=25%. The reason that the conversion efficiency was somewhat lower than the first embodiment and the G1/W greater, is thought to be due to insufficient diffusion of silicon between the region with high temperature and region with low temperature in the melt.

(Third Embodiment)

The present embodiment illustrates a method for further improving the results of the second embodiment. With the present embodiment, a liquid-phase growth apparatus generally the same as the liquid-phase growth apparatus shown in FIGS. 4A and 4B is used, but the crucible can be slowly rotated on its axis.

Substrates manufactured in the same way as with the second embodiment were used. Also, the heat was controlled in the same way as with the second embodiment such that the temperature of the melt near the heater 402a and the temperature of the melt near the heater 402b in FIGS. 4A and 4B changed as indicated by Ta and Tb in FIG. 6. Further, over the time from t0 to tf, the support for the substrates was rotated at the same timing as the comparative example 2. During this time, the crucible was rotate at a rate of one rotation every 5 minutes. A solar cell was fabricated in the same way as the second embodiment, using the grown poly crystals.

The conversion efficiency was 15.2% on average, and microscope observation of the cross-section thereof revealed an average of G1/W=18%. The reason that the conversion efficiency was higher and the G1/W was smaller than the second embodiment is thought to be due to the crucible rotating slowly which promotes diffusion, so precipitation of silicon onto the substrate occurs actively at the low temperature region, while melt-back of silicon from the substrate occurs actively in the high temperature region, consequently exhibiting contrast between the supersaturated region and unsaturated region.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A liquid-phase growth method for immersing a polycrystalline substrate in a melt in a crucible wherein crystal ingredients are dissolved, thereby growing poly crystals upon said substrate, said method comprising:
    a first step for growing poly crystals; and
    a second step for melting a part of the poly crystals grown in said first step in said melt;
    wherein the relative position between the substrate and melt is changed between said first step and second step, bringing melt with different temperature into contact with the polycrystalline surface.

2. A liquid-phase growth method according to claim 1, wherein, in said second step, a region of 5% or more but 30% or less of a thickness of the poly crystals grown in said first step is melted in said melt.

3. A liquid-phase growth method according to claim 2, wherein said first step and said second step are alternately repeated a plurality of times.

4. A liquid-phase growth method according to claim 3, wherein, in said first step, said substrate is brought into contact with melt with a relatively high temperature, and in said second step, said substrate is brought into contact with melt with a relatively low temperature.

5. A liquid-phase growth method according to claim 3, wherein the thickness of the poly crystals to be grown in said first step is 1 to 20 µm.

6. A liquid-phase growth method according to claim 5, wherein, in said first step, said substrate is brought into contact with melt with a relatively high temperature, and in said second step, said substrate is brought into contact with melt with a relatively low temperature; and wherein the temperature in each region of said melt is lowered.

7. A liquid-phase growth method according to claim 6, wherein said first step and said second step are carried out in the same crucible.

8. A liquid-phase growth method according to claim 7, wherein said substrate is alternately brought into contact with melt with a relatively high temperature and with melt with a relatively low temperature in said first and second steps, by vertically reciprocally moving said substrate in said crucible.

9. A liquid-phase growth method according to claim 7, wherein said substrate is alternately brought into contact with melt with a relatively high temperature and with melt with a relatively low temperature in said first and second steps, by positioning said substrate at a position other than on the center axis of said crucible, and rotating said substrate around said center axis.

10. A liquid-phase growth method according to claim 6, wherein said first step and said second step are carried out in different crucibles.

11. A liquid-phase growth method according to claim 5, wherein the content of crystal ingredients per increment volume in said melt coming into contact with said poly crystal surface differs between said first step and said second step.

* * * * *

UNITED STATES PATENT AND TRADEMARK OFFICE
CERTIFICATE OF CORRECTION

| | | |
|---|---|---|
| PATENT NO. | : 6,951,585 B2 | |
| DATED | : October 4, 2005 | |
| INVENTOR(S) | : Katsumi Nakagawa et al. | |

It is certified that error appears in the above-identified patent and that said Letters Patent is hereby corrected as shown below:

Title page,
Item [56], References Cited, OTHER PUBLICATIONS, "Haruo Itoh et al.," reference, "Metallurgical-Grad Polychrystalline" should read -- Metallurgical-Grade Polychrystalline --.

Column 1,
Line 40, "for solving" should read -- to solve --; and
Line 51, "SiH2Cl2" should read -- $SiH_2Cl_2$ --.

Column 3,
Line 19, "grown" should read -- growth --.

Column 4,
Line 39, "loosing" should read -- losing --.

Column 7,
Line 65, "Thus" should read -- This --.

Column 8,
Line 31, "reached" should read -- was reached --; and
Line 37, "as" should read -- was --.

Column 9,
Line 5, "reveled" should read -- revealed --; and
Line 31, "grove," should read -- groove, --.

Column 10,
Line 12, "to for temperature" should read -- for temperature to --.

Column 11,
Line 3, "portion 403*a*" should read -- position 403*a* --;
Line 6, "portion" should read -- position --;
Line 7, "changed" should read -- be changed --;
Line 10, "results," should read -- result, --; and
Line 47, "rotate" should read -- rotated --.

UNITED STATES PATENT AND TRADEMARK OFFICE
CERTIFICATE OF CORRECTION

PATENT NO.     : 6,951,585 B2
DATED          : October 4, 2005
INVENTOR(S)    : Katsumi Nakagawa et al.

It is certified that error appears in the above-identified patent and that said Letters Patent is hereby corrected as shown below:

Column 12,
Line 38, "and" should read -- ¶and --.

Signed and Sealed this

Second Day of May, 2006

JON W. DUDAS
*Director of the United States Patent and Trademark Office*